United States Patent
Yamamoto (10) Patent No.: US 10,269,543 B2
(45) Date of Patent: Apr. 23, 2019

(54) LOWER ELECTRODE AND PLASMA PROCESSING APPARATUS

(71) Applicant: Tokyo Electron Limited, Tokyo (JP)

(72) Inventor: Takashi Yamamoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 318 days.

(21) Appl. No.: 14/408,380

(22) PCT Filed: Jul. 2, 2013

(86) PCT No.: PCT/JP2013/068166
§ 371 (c)(1),
(2) Date: Dec. 16, 2014

(87) PCT Pub. No.: WO2014/013863
PCT Pub. Date: Jan. 23, 2014

(65) Prior Publication Data
US 2015/0206722 A1   Jul. 23, 2015

Related U.S. Application Data

(60) Provisional application No. 61/674,903, filed on Jul. 24, 2012.

(30) Foreign Application Priority Data

Jul. 17, 2012   (JP) ................. 2012-158842

(51) Int. Cl.
H01J 37/32    (2006.01)
H01L 21/683   (2006.01)
C23C 4/10     (2016.01)

(52) U.S. Cl.
CPC .......... H01J 37/32559 (2013.01); C23C 4/10 (2013.01); H01J 37/3255 (2013.01);
(Continued)

(58) Field of Classification Search
CPC ........... H01J 37/32715; H01J 37/32559; H01J 37/3255; H01J 37/32568; H01J 37/32642; H01L 21/6833; C23C 4/10; C23C 16/4581
See application file for complete search history.

(56) References Cited

U.S. PATENT DOCUMENTS 5,909,354 A * 6/1999 Harada ................ B23Q 3/15
                                                    279/128
6,494,958 B1 * 12/2002 Shamouilian ....... C23C 16/4581
                                                    118/723 E
(Continued)

FOREIGN PATENT DOCUMENTS

JP    06-232243 A    8/1994
JP    09-069554 A    3/1997
(Continued)

OTHER PUBLICATIONS

KR10-1147961B1 Jeon et al. English Machine Translation retrieved from Espacenet Nov. 28, 2018 (Year: 2012).*
(Continued)

Primary Examiner — Rakesh K Dhingra
Assistant Examiner — Laureen Chan
(74) Attorney, Agent, or Firm — Pearne & Gordon LLP (57) ABSTRACT

A lower electrode 2 includes a conductive base member 2a to which a high frequency power is applied; an electrostatic chuck 6, having an insulating layer 6b formed on a top surface of the base member 2a to cover an electrode 6a, configured to electrostatically attract a semiconductor wafer W as a target of a plasma process onto the insulating layer 6b; a focus ring 5 provided on a top surface of the insulating layer 6b of the electrostatic chuck 6 to surround the semiconductor wafer W; and a thermally sprayed film 100, which is conductive and formed on a portion of the insulating layer 6b of the electrostatic chuck 6 positioned between the focus
(Continued)

ring 5 and the base member 2*a* by using a composite material in which titania is added to an insulating material for the insulating layer at a preset weight ratio.

9 Claims, 4 Drawing Sheets

(52) U.S. Cl.
CPC .. *H01J 37/32568* (2013.01); *H01J 37/32642* (2013.01); *H01J 37/32715* (2013.01); *H01L 21/6833* (2013.01)

(56) References Cited

U.S. PATENT DOCUMENTS

| | | | | |
|---|---|---|---|---|
| 2007/0258186 A1* | 11/2007 | Matyushkin | ...... | H01L 21/67109 361/234 |
| 2008/0017104 A1* | 1/2008 | Matyushkin | ...... | H01L 21/67109 118/696 |
| 2008/0236749 A1* | 10/2008 | Koshimizu | ....... | H01J 37/32091 156/345.33 |
| 2009/0243236 A1* | 10/2009 | Hida | .................. | H01L 21/6831 279/128 |
| 2010/0326957 A1* | 12/2010 | Maeda | .................... | H01J 37/20 216/67 |
| 2011/0240221 A1 | 10/2011 | Yamamoto | | |
| 2012/0281334 A1* | 11/2012 | Sasaki | ................ | H01L 21/6831 361/234 |

FOREIGN PATENT DOCUMENTS

| | | |
|---|---|---|
| JP | 2011-210958 A | 10/2011 |
| KR | 101147961 B1 * | 5/2012 |

OTHER PUBLICATIONS

International Search Report for PCT/JP2013/068166 dated Oct. 1, 2013.

\* cited by examiner

LOWER ELECTRODE AND PLASMA PROCESSING APPARATUS

CROSS-REFERENCE TO RELATED APPLICATION

This Application is a U.S. national phase application under 35 U.S.C. § 371 of PCT Application No. PCT/JP2013/068166 filed on Jul. 2, 2013, which claims the benefit of Japanese Patent Application No. 2012-158842 filed on Jul. 17, 2012, and U.S. Provisional Application Ser. No. 61/674,903 filed on Jul. 24, 2012, the entire disclosures of which are incorporated herein by reference.

TECHNICAL FIELD

The various embodiments described herein pertain generally to a lower electrode and a plasma processing apparatus.

BACKGROUND ART

In a semiconductor manufacturing process, a plasma processing apparatus configured to perform a plasma process for the thin film deposition, the etching, or the like is widely utilized. Examples of such a plasma processing apparatus include a plasma CVD (Chemical Vapor Deposition) apparatus configured to perform a thin film deposition process, a plasma etching apparatus configured to perform an etching process, and so forth.

The plasma processing apparatus includes a processing vessel having a plasma processing space formed therein; a lower electrode provided within the processing vessel and configured to mount thereon a processing target substrate; an upper electrode disposed to face the lower electrode with the plasma processing space therebetween; and so forth. Further, the lower electrode of the plasma processing apparatus includes a conductive base member to which a high frequency power is applied; an electrostatic chuck having an insulating layer which is formed on a top surface of the base member and covers the electrode, and configured to electrostatically attract and hold the processing target substrate onto the insulating layer; a focus ring provided on a top surface of the insulating layer of the electrostatic chuck to surround the processing target substrate; and so forth.

Here, in the lower electrode of the plasma processing apparatus, a relatively large potential difference is generated between the focus ring and the processing target substrate and the base member of the lower electrode. Due to this potential difference, an electric discharge (arcing) may occur between the processing target substrate and the base member of the lower electrode or ambient structures thereof. If the electric discharge occurs between the processing target substrate and the base member of the lower electrode or the ambient structures thereof, the processing target substrate or chips on the processing target substrate may be damaged. In this regard, Patent Document 1 describes a configuration in which a resistor pin made of titania is embedded in the insulating layer of the electrostatic chuck, and the focus ring and the base member of the lower electrode are electrically connected via the resistor pin in order to reduce the potential difference between the focus ring and the base member of the lower electrode.

In the prior art technique of burying the resistor pin made of the titania in the insulating layer of the electrostatic chuck, however, impedance may be locally biased between the insulating layer of the electrostatic chuck and the resistor pin, though occurrence of the electric discharge is suppressed. Accordingly, it is difficult to maintain uniformity of a processing target surface of the processing target substrate.

Conventionally, as a way to solve this problem, there is known a method of forming a thermally sprayed film, which is conductive, on an insulating layer of an electrostatic chuck in order to suppress an electric discharge without using a resistor pin. For example, it is described in Patent Document 2 that a thermally sprayed film made of a composite material containing a mixture of an insulating material and titania is formed on the entire surface of the insulating layer of the electrostatic chuck, and a processing target substrate is attracted to and held on this thermally sprayed film. In this configuration, since the processing target substrate and the base member of the lower electrode are electrically connected via the thermally sprayed film containing the titania, an electric potential difference between the processing target substrate and the base member of the lower electrode can be reduced, and, resultantly, an electric discharge can be suppressed.

Patent Document 1: Japanese Patent Laid-open Publication No. 2011-210958
Patent Document 2: Japanese Patent Laid-open Publication No. H09-069554

DISCLOSURE OF THE INVENTION

Problems to be Solved by the Invention

In the prior art technique of attracting and holding the processing target substrate onto the thermally sprayed film containing the titania, however, the processing target substrate may be contaminated with titanium particles, though occurrence of an electric discharge can be suppressed. That is, in the prior art, since the processing target substrate is brought into direct contact with the thermally sprayed film containing the titania, the processing target substrate may be contaminated with titanium particles dissociated from the titania during a plasma process.

Means for Solving the Problems

In one example embodiment, a lower electrode includes a conductive base member to which a high frequency power is applied; an electrostatic chuck, having an insulating layer formed on a top surface of the base member to cover an electrode, configured to electrostatically attract a processing target substrate as a target of a plasma process onto the insulating layer; a focus ring provided on a top surface of the insulating layer of the electrostatic chuck to surround the processing target substrate; and a thermally sprayed film, which is conductive and formed on a portion of the insulating layer of the electrostatic chuck positioned between the focus ring and the base member by using a composite material in which titania is added to an insulating material for the insulating layer at a preset weight ratio.

Effect of the Invention

In accordance with the example embodiments, it is possible to provide a plasma processing apparatus and a lower electrode capable of suppressing an electric discharge from occurring and, also, capable of suppressing a processing target substrate from being contaminated with titanium particles.

DETAILED DESCRIPTION

In the following, example embodiments will be described, and reference is made to the accompanying drawings, which form a part of the description. In various drawings, like or corresponding parts will be assigned like reference numerals.

Figure 1:
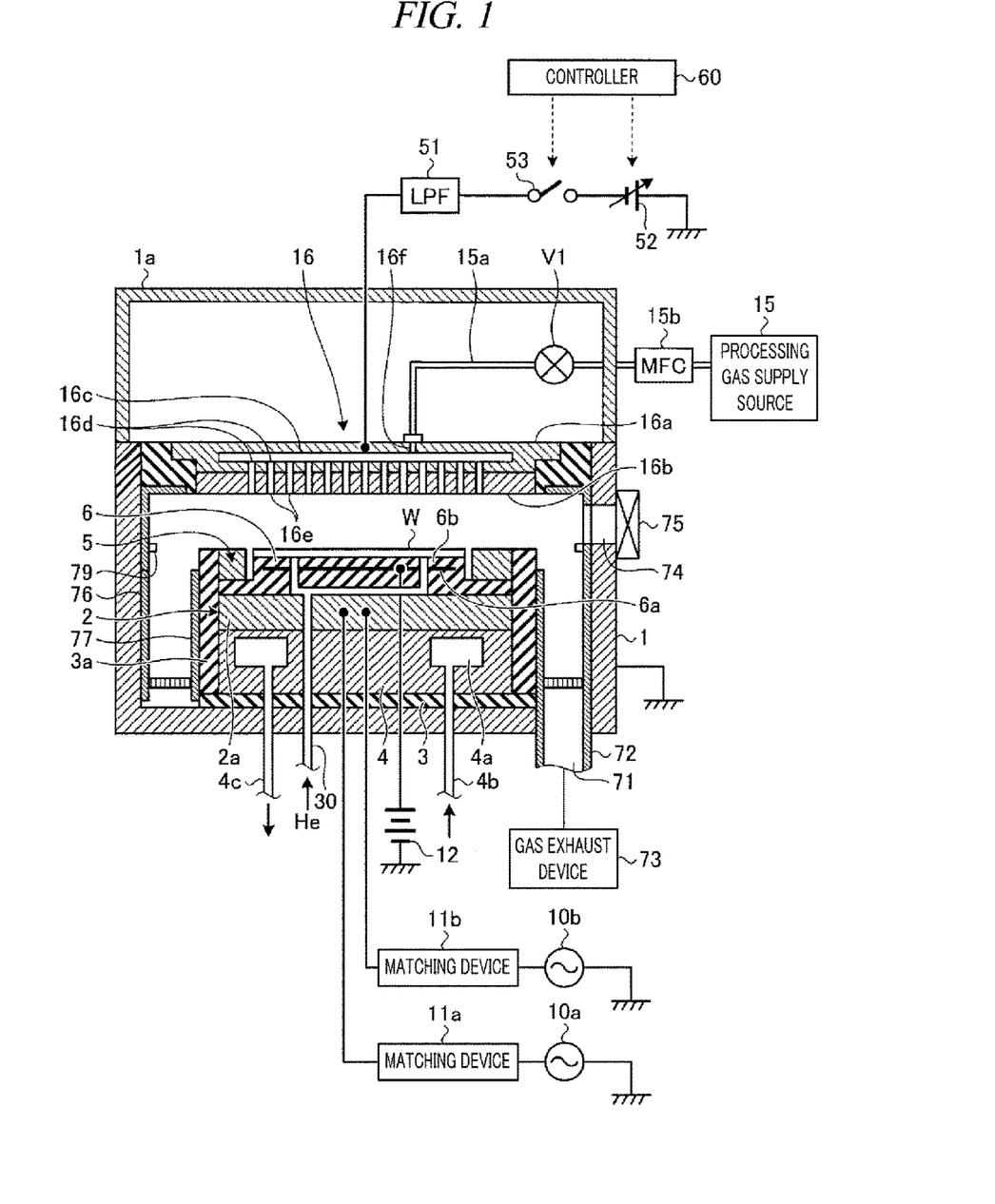
FIG. 1 is a longitudinal cross sectional view illustrating a schematic configuration of a plasma processing apparatus in accordance with an example embodiment.

First, an overall configuration of a plasma processing apparatus will be explained. FIG. 1 is a longitudinal cross sectional view illustrating a schematic configuration of a plasma processing apparatus in accordance with an example embodiment.

The plasma processing apparatus includes a hermetically sealed processing chamber (processing vessel) 1 which is electrically grounded. The processing chamber 1 is of a cylindrical shape and is made of, but not limited to, aluminum. The processing chamber 1 has therein a plasma processing space for performing therein a plasma process. A lower electrode 2 configured to mount thereon a semiconductor wafer W as a processing target substrate is provided within the processing chamber 1. A base member 2a of the lower electrode 2 is made of a conductive metal such as, but not limited to, aluminum. The lower electrode 2 is supported on a conductive supporting member 4 via an insulating plate 3. Further, a cylindrical inner wall member 3a made of, but not limited to, quartz is provided to surround the lower electrode 2 and the supporting member 4.

The base member 2a of the lower electrode 2 is connected with a first RF power supply 10a via a first matching device 11a and with a second RF power supply 10b via a second matching device 11b. The first RF power supply 10a is for plasma generation, and a high frequency power of a preset frequency (equal to or higher than 27 MHz, e.g., 40 MHz) is supplied from the first RF power supply 10a to the base member 2a of the lower electrode 2. Further, the second RF power supply 10b is for ion attraction (bias), and a high frequency power of a preset frequency (equal to or lower than 13.56 MHz, e.g., 3.2 MHz) lower than that of the first RF power supply 10a is supplied from the second RF power supply 10b to the base member 2a of the lower electrode 2. A detailed configuration of the lower electrode 2 will be elaborated later.

An upper electrode 16 is provided above the lower electrode 2, facing the lower electrode 2 with the plasma processing space of the processing chamber 1 therebetween. The upper electrode 16 and the lower electrode 2 are configured to serve as a pair of electrodes. A space between the upper electrode 16 and the lower electrode 2 is the plasma processing space for generating plasma therein.

A coolant path 4a is formed within the supporting member 4, and the coolant path 4a is connected to a coolant inlet line 4b and a coolant outlet line 4c. By circulating an appropriate coolant, for example, cooling water through the coolant path 4a, the supporting member 4 and the lower electrode 2 can be controlled to a preset temperature. Further, a backside gas supply line 30 configured to supply a cold heat transfer gas (backside gas) such as a helium gas to a rear side of the semiconductor wafer W is provided to penetrate the lower electrode 2. The backside gas supply line 30 is connected to a non-illustrated backside gas supply source. With this configuration, the semiconductor wafer W mounted on a top surface of the lower electrode 2 can be controlled to a preset temperature.

The upper electrode 16 is provided at a ceiling wall portion of the processing chamber 1. The upper electrode 16 includes a main body 16a; and a top plate 16b serving as an electrode plate. The upper electrode 16 is supported at a top portion of the processing chamber 1. The main body 16a is made of a conductive material such as, but not limited to, aluminum having an anodically oxidized surface and is configured to support the top plate 16b it in a detachable manner.

A gas diffusion space 16c is formed within the main body 16a, and multiple gas through holes 16d are formed in a bottom portion of the main body 16a to be located under the gas diffusion space 16c. Further, gas discharge holes 16e are formed through the top plate 16b in the thickness direction thereof and are overlapped with the gas through holes 16d. With this configuration, a processing gas supplied into the gas diffusion space 16c is introduced into the processing chamber 1 through the gas through holes 16d and the gas discharge holes 16e while being dispersed in a shower shape. Further, the main body 16a is equipped with a non-illustrated pipeline configured to circulate a coolant so that the upper electrode 16 can be cooled to a required temperature during a plasma etching process.

The main body 16a is also provided with a gas inlet opening 16f through which the processing gas is introduced into the gas diffusion space 16c. One end of a gas supply line 15a is connected to the gas inlet opening 16f, and the other end of the gas supply line 15a is connected to a processing gas supply source 15 configured to supply a processing gas for plasma etching. The gas supply line 15a is equipped with a mass flow controller (MFC) 15b and an opening/closing valve V1 in sequence from the upstream side. The processing gas for plasma etching is supplied into the gas diffusion space 16c through the gas supply line 15a, and then, introduced from the gas diffusion space 16c into the processing chamber 1 through the gas through holes 16d and the gas discharge holes 16e while being dispersed in a shower shape.

The upper electrode 16 is electrically connected with a variable DC power supply 52 via a low pass filter (LPF) 51. The variable DC power supply 52 is configured to turn on and off a power supply by an on/off switch 53. Electric current/voltage and on/off operations of the variable DC power supply 52 are controlled by a controller 60 to be described later. Further, as will be described later, when high frequency powers from the first RF power supply 10a and the second RF power supply 10b are applied to the lower electrode 2 and plasma is thus generated in the plasma processing space, the on/off switch 53 is turned on by the controller 60 if necessary, so that a preset DC voltage is supplied to the upper electrode 16.

A cylindrical grounding conductor 1a is extended upward from a sidewall of the processing chamber 1 up to a height position higher than the upper electrode 16. The cylindrical grounding conductor 1a has a ceiling wall at a top portion thereof.

A gas exhaust opening 71 is formed at a bottom of the processing chamber 1, and a gas exhaust device 73 is connected to the gas exhaust opening 71 via a gas exhaust line 72. The gas exhaust device 73 has a vacuum pump, and by operating the vacuum pump, the gas exhaust device 73 decompresses the inside of the processing chamber 1 to a preset vacuum degree. Meanwhile, a loading/unloading opening 74 for the semiconductor wafer W is formed at the sidewall of the processing chamber 1, and a gate valve 75 configured to open and close the loading/unloading opening 74 is provided at the loading/unloading opening 74.

In drawings, reference numerals 76 and 77 are detachable deposition shields. The deposition shield 76 is provided along an inner wall surface of the processing chamber 1 and serves to suppress an etching byproduct (deposit) from adhering to the processing chamber 1. A conductive member (GND block) 79 is provided at a height position of the deposition shield 76 to be substantially the same height as the semiconductor wafer W. The conductive member 79 suppresses an abnormal electric discharge.

An overall operation of the plasma processing apparatus having the above-described configuration is controlled by the controller 60. The controller 60 includes a process controller which has a CPU and is configured to control individual components of the plasma processing apparatus; a user interface; and a storage unit.

The user interface of the controller 60 include a keyboard through which a process manager inputs commands to manage the plasma etching apparatus; a display which visually displays an operational status of the plasma etching apparatus; and so forth.

The storage unit of the controller 60 stores therein recipes including processing condition data or control programs (software) for implementing various processes in the plasma etching apparatus under the control of the process controller. In response to an instruction from the user interface of the controller 60 or the like, a required recipe is retrieved from the storage unit and executed by the process controller, so that a required process is performed in the plasma etching apparatus under the control of the process controller of the controller 60. The recipes including the processing condition data or the control program can be used while being stored on a computer-readable storage medium (e.g., a hard disk, a CD, a flexible disk, a semiconductor memory, or the like), or can be used on-line by being received from another apparatus through, e.g., a dedicated line, whenever necessary.

Figure 2:
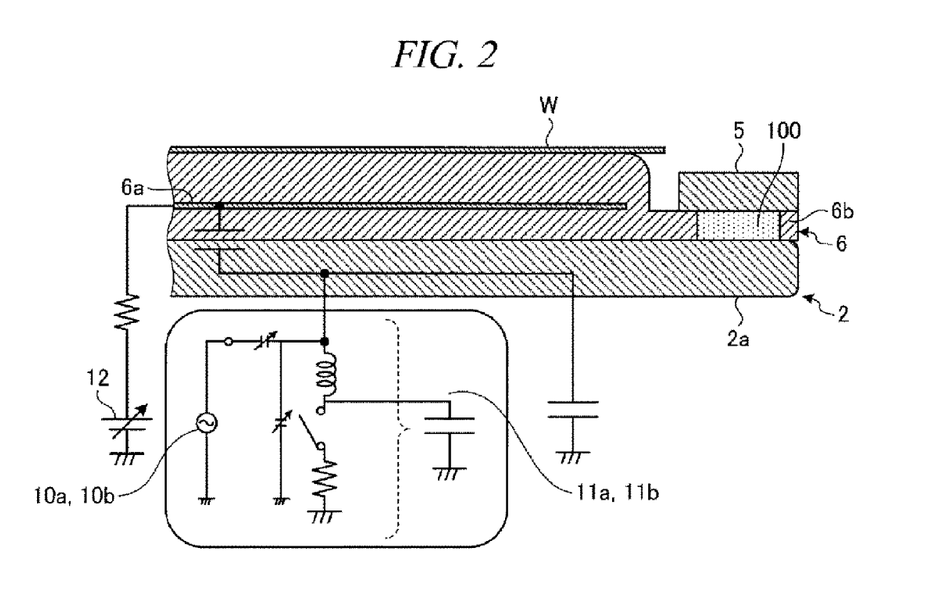
FIG. 2 is a longitudinal cross sectional view schematically illustrating a configuration of a lower electrode in accordance with the example embodiment.

Now, a detailed configuration of the lower electrode 2 shown in FIG. 2 will be elaborated. FIG. 2 is a longitudinal cross sectional view schematically illustrating a configuration of the lower electrode in accordance with the example embodiment. As depicted in FIG. 2, the lower electrode 2 includes the base member 2a, an electrostatic chuck 6, a focus ring 5 and a thermally sprayed film 100.

The base member 2a has a substantially cylindrical shape made of a conductive metal such as, but not limited to, aluminum. The first RF power supply 10a and the second RF power supply 10b are connected to the base member 2a via the first matching device 11a and the second matching device 11b, respectively. In FIG. 2, electric connection between the base member 2a and the first and second RF power supplies 10a and 10b is indicated as an equivalent circuit. A high frequency power of a preset frequency (equal to or higher than 27 MHz, e.g., 40 MHz) is supplied from the first RF power supply 10a to the base member 2a of the lower electrode 2. Further, a high frequency power of a preset frequency (equal to or lower than 13.56 MHz, e.g., 3.2 MHz) lower than that of the first high frequency power supply 10a is supplied from the second RF power supply 10b to the base member 2a of the lower electrode 2. Polarization charges are generated between the base member 2a and an electrode 6a of the electrostatic chuck 6 to be described later, and a polarized potential of the polarization charges is divided by a high frequency application circuit connected to the base member 2a. The polarization potential of the polarization charges is determined by a high frequency application circuit constant and a chamber circuit constant.

The electrostatic chuck 6 has an insulating layer 6b which is formed on a top surface of the base member 2a and covers the electrode 6a. A DC power supply 12 is connected to the electrode 6a. The insulating layer 6b is made of an insulating material such as, but not limited to, alumina ($Al_2O_3$). The electrostatic chuck 6 attracts and holds the semiconductor wafer W onto the insulating layer 6b by applying a DC voltage to the electrode 6a from the DC power supply 12.

The focus ring 5 is provided on a top surface of the insulating layer 6b of the electrostatic chuck 6 to surround the semiconductor wafer W. The focus ring 5 has an annular shape made of a conductive material such as, but not limited to, silicon. The focus ring 5 is electrically connected with the base member 2a of the lower electrode 2 with the thermally sprayed film 100 therebetween.

The thermally sprayed film 100 is provided at a portion of the insulating layer 6b of the electrostatic chuck 6 positioned between the focus ring 5 and the base member 2a. The thermally sprayed film 100 is conductive and formed by using a composite material prepared by adding titania ($TiO_2$) to an insulating material for forming the insulating layer 6b at a preset weight ratio. The thermally sprayed film 100 is formed annularly at the portion of the insulating layer 6b of the electrostatic chuck 6 positioned between the focus ring 5 and the base member 2a, and connects the focus ring 5 and the base member 2a electrically. In other words, in order to avoid a direct contact between the semiconductor wafer W and the thermally sprayed film 100 containing the titania ($TiO_2$), the thermally sprayed film 100 is provided at the portion of the insulating layer 6b of the electrostatic chuck 6 which is positioned between the focus ring 5 and the base member 2a and is spaced apart from the semiconductor wafer W by a preset distance.

The thermally sprayed film 100 is formed by using a composite material containing the titania ($TiO_2$) mixed with the insulating material at a preset weight ratio. In the present example embodiment, the thermally sprayed film 100 is formed by using a composite material containing the titania ($TiO_2$) mixed with alumina ($Al_2O_3$) as the insulating material at a preset weight ratio (hereinafter, simply referred to as "composite material"). Desirably, the thermally sprayed film 100 is formed by using this composite material such that a resistivity of the portion of the insulating layer 6b of the electrostatic chuck 6 positioned between the focus ring 5 and the base member 2a is in the range from $10^6$ $\Omega\cdot$cm to $10^{10}$ $\Omega\cdot$cm.

Here, the reason why the thermally sprayed film 100 is formed by using the composite material such that the resistivity of the portion of the insulating layer 6b of the electrostatic chuck 6 positioned between the focus ring 5 and the base member 2a is in the range from $10^6$ $\Omega\cdot$cm to $10^{10}$ $\Omega\cdot$cm will be explained. In a case that the resistivity of the portion of the insulating layer 6b of the electrostatic chuck 6 positioned between the focus ring 5 and the base member 2a is set to a value smaller than $10^6$ $\Omega\cdot$cm, since impedance of the focus ring 5 is lower than impedance of the semiconductor wafer, plasma would be concentrated locally in the vicinity of the focus ring 5. Meanwhile, in a case that the resistivity of the portion of the insulating layer 6b of the electrostatic chuck 6 positioned between the focus ring 5 and the base member 2a is set to a value larger than $10^{10}$ Ω·cm, since the insulation property of the portion of the insulating layer 6b between the focus ring 5 and the base member 2a increases excessively, it may be difficult for a DC to flow from the focus ring 5 to the base member 2a via the thermally sprayed film 100. That is, in the present example embodiment, in order to allow an appropriate DC according to a potential difference between the focus ring 5 and the base member 2a to be flown through the thermally sprayed film 100, the thermally sprayed film 100 is formed by using the composite material such that the resistivity of the portion of the insulating layer 6b of the electrostatic chuck 6 positioned between the focus ring 5 and the base member 2a is in the range from $10^6$ Ω·cm to $10^{10}$ Ω·cm.

The semiconductor wafer W and the focus ring 5 exposed to the plasma during the plasma process are made to have substantially the same electric potential (e.g., about −2000 V at maximum) due to the self-bias. Meanwhile, the base member 2a of the lower electrode 2 has a plus potential due to the high DC voltage applied to the electrode 6a of the electrostatic chuck 6. In the present example embodiment, the thermally sprayed film 100 is formed by using the composite material such that the resistivity of the portion of the insulating layer 6b of the electrostatic chuck 6 positioned between the focus ring 5 and the base member 2a is in the range from $10^6$ Ω·cm to $10^{10}$ Ω·cm. Accordingly, an appropriate DC according to the potential difference between the focus ring 5 and the base member 2a flows through the thermally sprayed film 100. Due to this DC, the potential difference between the focus ring 5 and the base member 2a of the lower electrode 2 can be reduced to, e.g., about 500 V. That is, by generating the DC, the electric potential of the base member 2a of the lower electrode 2 comes close to the electric potential of the focus ring 5. As a result, the electric potential between the base member 2a of the lower electrode 2 and the semiconductor wafer W also decreases, so that it is possible to suppress the electric discharge between the semiconductor wafer W and the base member 2a of the lower electrode 2 or ambient structures thereof from occurring. Therefore, yield of chips on the semiconductor wafer W can be improved to increase the productivity thereof. Furthermore, it is possible to suppress an electric discharge between the focus ring 5 and the base member of the lower electrode 2 or the ambient structures thereof from occurring.

Figure 3:
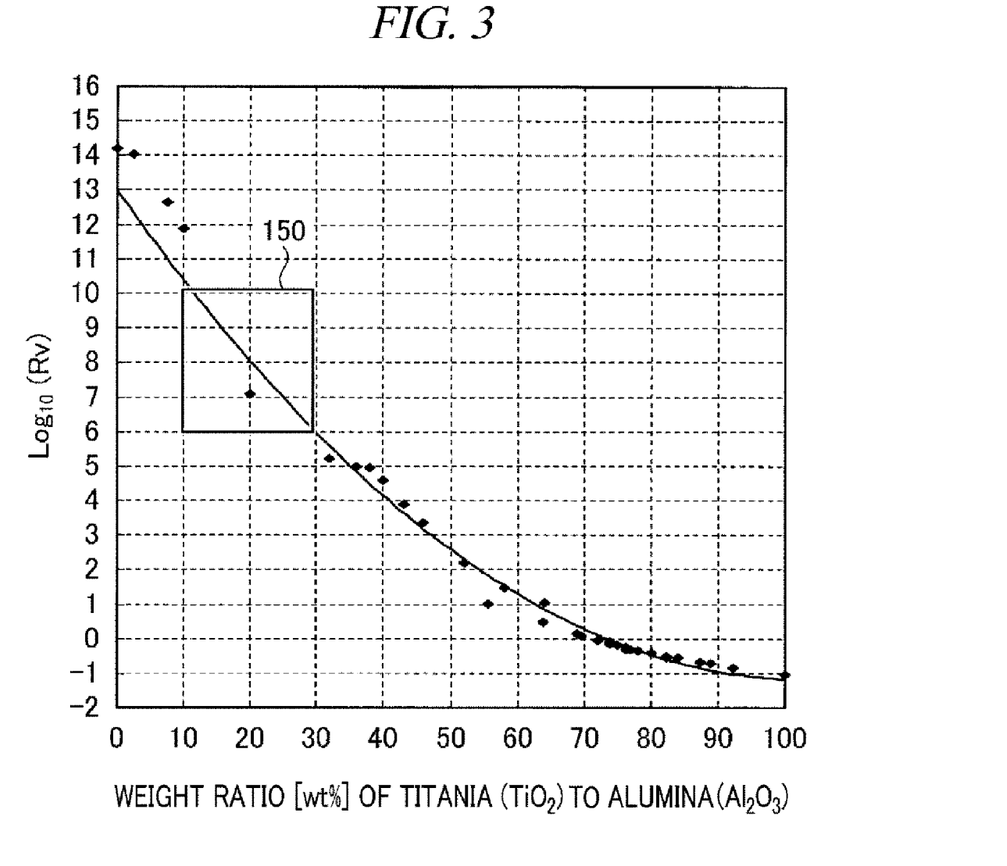
FIG. 3 is diagram for explaining a weight ratio of a composite material for forming a thermally sprayed film.

Now, the weight ratio of the composite material for forming the thermally sprayed film 100 will be explained. FIG. 3 is a diagram for explaining the weight ratio of the composite material for forming the thermally sprayed film. In FIG. 3, a vertical axis represents a magnitude of a resistivity (Rv[Ω·cm]) of the portion of the insulating layer 6b of the electrostatic chuck 6 positioned between the focus ring 5 and the base member 2a, and a horizontal axis indicates a weight ratio [wt %] of titania ($TiO_2$) to alumina ($Al_2O_3$) in the composite material. The magnitude of the resistivity (Rv[Ω·cm]) is indicated by a logarithm of resistivity (Rv[Ω·cm]) to base 10. As indicated by a frame 150 in FIG. 3, in case that the weight ratio of the titania to the alumina in the composite material is in the range from 10 wt % to 30 wt %, the resistivity (Rv) of the portion of the insulating layer 6b of the electrostatic chuck 6 positioned between the focus ring 5 and the base member 2a is in the range from $10^6$ Ω·cm to $10^{10}$ Ω·cm. When the resistivity ranges from $10^6$ Ω·cm to $10^{10}$ Ω·cm, an DC flows from the focus ring 5 to the base member 2a via the thermally sprayed film 100, so that the electric potential of the base member 2a of the lower electrode 2 can be made close to the electric potential of the focus ring 5. Further, it is proved that a relative permittivity of the portion of the insulating layer 6b of the electrostatic chuck 6 positioned between the focus ring 5 and the base member 2a is maintained at 8 to 14 if the weight ratio of the titania to the alumina in the composite material is in the range from 10 wt % to 30 wt %. Thus, in the present example embodiment, the weight ratio of the titania in the composite material is set to be in the range from 10 wt % to 30 wt %.

In the lower electrode in accordance with the above-described example embodiment, the terminally sprayed film 100 containing the titania is formed on the portion of the insulating layer 6b of the electrostatic chuck 6 positioned between the focus ring 5 and the base member 2a. Accordingly, it is possible to allow an appropriate DC according to the potential difference between the focus ring 5 and the base member 2a to flow through the thermally sprayed film 100 during the plasma process. Further, the thermally sprayed film 100 containing the titania can be provided to be spaced apart from the semiconductor wafer W. As a consequence, it is possible to suppress the semiconductor wafer W from being contaminated with titanium particles dissociated from the titania contained in the thermally sprayed film 100 while also suppressing the electric discharge between the semiconductor wafer W and the base 2a of the lower electrode 2 or the ambient structures thereof from occurring during the plasma process.

Figure 4:
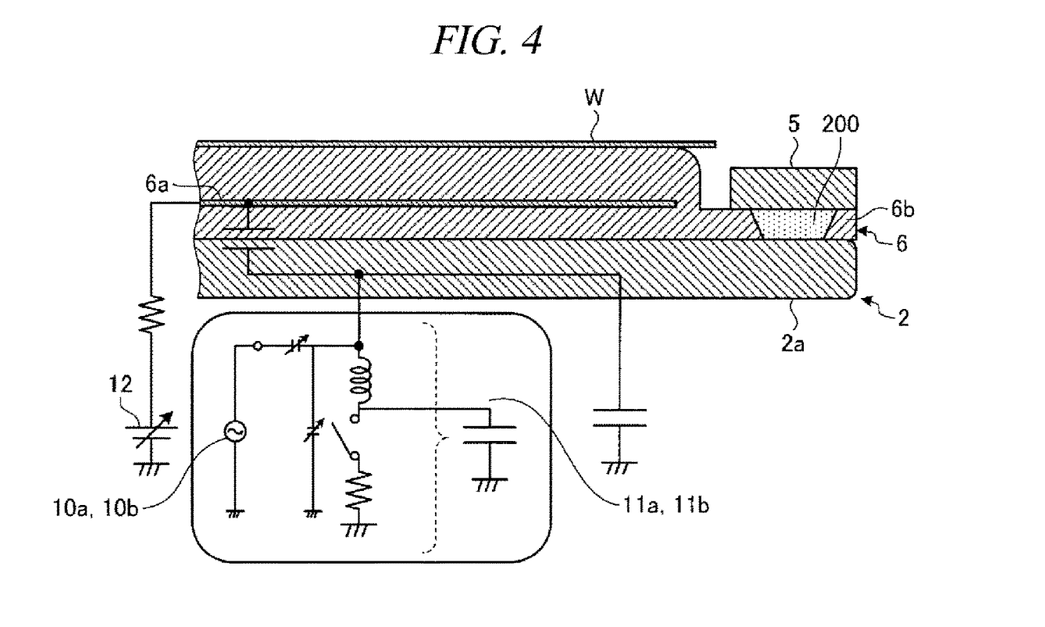
FIG. 4 is a longitudinal cross sectional view illustrating a modification example of the lower electrode in accordance with the example embodiment.

Furthermore, in the above-described example embodiment, the thermally sprayed film 100 of the lower electrode 2 is formed to have a rectangular cross sectional shape. However, the example embodiment is not limited thereto. Below, a modification example of the lower electrode will be explained. FIG. 4 is a longitudinal cross sectional view illustrating the modification example of the lower electrode in accordance with the example embodiment.

As depicted in FIG. 4, a thermally sprayed film 200 of the lower electrode 2 in accordance with the modification example is formed on a portion of the insulating layer 6b of the electrostatic chuck 6 positioned between the focus ring 5 and the base member 2a. The thermally sprayed film 200 has a cross-section of a bowl shape. In this example, the thermally sprayed film 200 is provided on the portion of the insulating layer 6b of the electrostatic chuck 6 positioned between the focus ring 5 and the base member 2a. In the cross sectional view, the thermally sprayed film 200 has a bowl shape which is narrowed toward the base member 2a.

In the lower electrode 2 of the modification example, adhesiveness between the insulating layer 6b of the electrostatic chuck 6 and the thermally sprayed film 200 can be improved by providing the thermally sprayed film 200 having the trapezoidal shape. Accordingly, it is possible to suppress a gap, which may serve as a resistance, between the thermally sprayed film 200 and the insulating layer 6b of the electrostatic chuck 6 from being formed. As a result, an appropriate DC according to a potential difference between the focus ring 5 and the base member 2a can be flown to the thermally sprayed film 200 stably. Therefore, it is possible to efficiently suppress an electric discharge from being generated between the semiconductor wafer W and the base member 2a of the lower electrode 2 or ambient structures thereof.

EXPLANATION OF CODES

1: Processing chamber (processing vessel)
2: Lower electrode

2a: Base member
5: Focus ring
6: Electrostatic chuck
6a: Electrode
6b: Insulating layer
16: Upper electrode
100, 200: Thermally sprayed film

I claim:

1. A lower electrode, comprising:
a conductive base member to which a high frequency power is applied;
an electrostatic chuck, having an insulating layer formed on a top surface of the conductive base member to cover an electrode, configured to electrostatically attract a processing target substrate as a target of a plasma process onto the insulating layer by applying a voltage applied to the electrode;
a focus ring provided on a top surface of the insulating layer of the electrostatic chuck to surround the processing target substrate; and
a thermally sprayed film, which is electrically conductive and formed on a portion of the insulating layer of the electrostatic chuck positioned between the focus ring and the conductive base member by using a composite material in which titania is added to an insulating material for the insulating layer at a preset weight ratio,
wherein the entire top surface of the thermally sprayed film is in direct contact with a bottom surface of the focus ring,
a bottom surface of the thermally sprayed film is in direct contact with a top surface of the conductive base member,
an outer side surface of the thermally sprayed film is covered with the insulating layer such that the outer side surface of the thermally sprayed film is not exposed to an environment outside of the electrostatic chuck, and
the top surface of the insulating layer is in direct contact with the bottom surface of the focus ring and a bottom surface of the insulating layer is in direct contact with the top surface of the conductive base member.

2. The lower electrode of claim 1,
wherein the thermally sprayed film is formed by using the composite material such that a resistivity of the portion of the insulating layer of the electrostatic chuck positioned between the focus ring and the conductive base member is in the range from $10^6$ Ω·cm to $10^{10}$ Ω·cm.

3. The lower electrode of claim 1,
wherein the preset weight ratio is in the range from 10 wt % to 30 wt %.

4. The lower electrode of claim 1,
wherein the thermally sprayed film is formed to have a cross-section of a bowl shape which is narrowed toward the base member.

5. A plasma processing apparatus, comprising:
a processing vessel having a plasma processing space formed therein;
a lower electrode provided in the processing vessel and configured to mount a processing target substrate thereon; and
an upper electrode provided to face the lower electrode with the plasma processing space therebetween,
wherein the lower electrode comprises:
a conductive base member to which a high frequency power is applied;
an electrostatic chuck, having an insulating layer formed on a top surface of the conductive base member to cover an electrode, configured to electrostatically attract a processing target substrate as a target of a plasma process onto the insulating layer by applying a voltage applied to the electrode;
a focus ring provided on a top surface of the insulating layer of the electrostatic chuck to surround the processing target substrate; and
a thermally sprayed film, which is electrically conductive and formed on a portion of the insulating layer of the electrostatic chuck positioned between the focus ring and the conductive base member by using a composite material in which titania is added to an insulating material for the insulating layer at a preset weight ratio,
wherein the entire top surface of the thermally sprayed film is in direct contact with a bottom surface of the focus ring,
a bottom surface of the thermally sprayed film is in direct contact with a top surface of the conductive base member,
an outer side surface of the thermally sprayed film is covered with the insulating layer such that the outer side surface of the thermally sprayed film is not exposed to an environment outside of the electrostatic chuck, and
the top surface of the insulating layer is in direct contact with the bottom surface of the focus ring and a bottom surface of the insulating layer is in direct contact with the top surface of the conductive base member.

6. The lower electrode of claim 1,
wherein a size of the top surface of the thermally sprayed film is the same as a size of the bottom surface of the thermally sprayed film.

7. The apparatus of claim 5,
wherein the thermally sprayed film is formed to have a cross-section of a bowl shape which is narrowed toward the base member.

8. The apparatus of claim 5,
wherein a size of the top surface of the thermally sprayed film is the same as a size of the bottom surface of the thermally sprayed film.

9. The apparatus of claim 6,
wherein the top surface of the thermally sprayed film is parallel with the bottom surface of the thermally sprayed film.

* * * * *